(12) United States Patent
Harasawa et al.

(10) Patent No.: US 8,868,823 B2
(45) Date of Patent: Oct. 21, 2014

(54) DATA STORAGE APPARATUS AND METHOD OF CALIBRATING MEMORY

(75) Inventors: Akinori Harasawa, Kunitachi (JP); Hiroyuki Moro, Hachio (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 438 days.

(21) Appl. No.: 13/072,338

(22) Filed: Mar. 25, 2011

(65) Prior Publication Data

US 2011/0296083 A1 Dec. 1, 2011

(30) Foreign Application Priority Data

May 31, 2010 (JP) ................................. 2010-125135

(51) Int. Cl.
*G06F 12/00* (2006.01)
*G11C 16/20* (2006.01)

(52) U.S. Cl.
CPC ...................................... *G11C 16/20* (2013.01)
USPC ............... 711/103; 711/5; 711/100; 711/154; 711/170

(58) Field of Classification Search
USPC ............................... 711/5, 100, 103, 154, 170
See application file for complete search history.

(56) References Cited

U.S. PATENT DOCUMENTS

| 7,289,378 | B2 | 10/2007 | Ivanov |
| 7,453,746 | B2 | 11/2008 | Ivanov |
| 7,489,569 | B2 | 2/2009 | Ivanov |
| 7,707,366 | B2 | 4/2010 | Tagawa |
| 2002/0026600 | A1 | 2/2002 | Jung et al. |
| 2005/0251305 | A1* | 11/2005 | Sato et al. ........................ 701/35 |
| 2010/0005225 | A1* | 1/2010 | Honda et al. .................. 711/103 |

FOREIGN PATENT DOCUMENTS

| JP | S63-282863 | 11/1988 |
| JP | 2000-259491 | 9/2000 |
| JP | 2006-215991 | 8/2006 |
| JP | 2007-183816 | 7/2007 |
| JP | 2007-531959 | 11/2007 |
| JP | 2009-526323 | 7/2009 |
| WO | WO 2007-095080 | 8/2007 |
| WO | WO 2009/084796 | 7/2009 |

OTHER PUBLICATIONS

Notice of Reasons for Rejection mailed by the Japan Patent Office on May 31, 2011 in corresponding Japanese patent app. No. 2010-125135 in 4 pages.
Explanation of Non-English Language References.

* cited by examiner

*Primary Examiner* — Midys Rojas
(74) *Attorney, Agent, or Firm* — Knobbe, Martens, Olson & Bear, LLP

(57) ABSTRACT

According to one embodiment, a data storage apparatus includes an interface module and a controller. The interface module is configured to control rewritable nonvolatile memories provided for the respective channels. The controller is configured to write calibration data to the nonvolatile memories of any channel designated, through the interface module at the same time, in order to perform calibration.

14 Claims, 3 Drawing Sheets

DATA STORAGE APPARATUS AND METHOD OF CALIBRATING MEMORY

CROSS-REFERENCE TO RELATED APPLICATIONS

This application is based upon and claims the benefit of priority from Japanese Patent Application No. 2010-125135, filed May 31, 2010, the entire contents of which are incorporated herein by reference.

FIELD

Embodiments described herein relate generally to a data storage apparatus that uses a nonvolatile memory as recording medium.

BACKGROUND

Solid-state drives (SSDs) have been developed as data storage apparatuses, each using NAND flash memories (hereinafter referred to as NAND memories in some cases) that are rewritable nonvolatile memories. Data storage apparatuses for use in servers or enterprises, in particular, are implemented by SSDs of large storage capacity.

In most high-speed IC memories, the timing of a strobe for latching data must be adjusted. (This adjustment is called calibration.) NAND memories operate at a relatively low speed. Nonetheless, the calibration must be performed on the NAND memories in order to provide an SSD having a large storage capacity. This is because many NAND memories are densely arranged in a single package, and the SSD is constituted by more and more packages. Ultimately, the interconnections run longer distances and the overall load increases, inevitably deforming the waveform of signals.

The larger the storage capacity of an SSD, the greater the number of interface channels provided for the NAND memories. Therefore, the calibration should be performed on the channels at high speed in order to manufacture an SSD with higher efficiency.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

DETAILED DESCRIPTION

Various embodiments will be described hereinafter with reference to the accompanying drawings.

In general, according to one embodiment, a data storage apparatus includes an interface module and a controller. The interface module is configured to control rewritable nonvolatile memories provided for the respective channels. The controller is configured to write calibration data to the nonvolatile memories of any channel designated, through the interface module at the same time, in order to perform calibration.

[Configuration of the Data Storage Apparatus]

Figure 1:
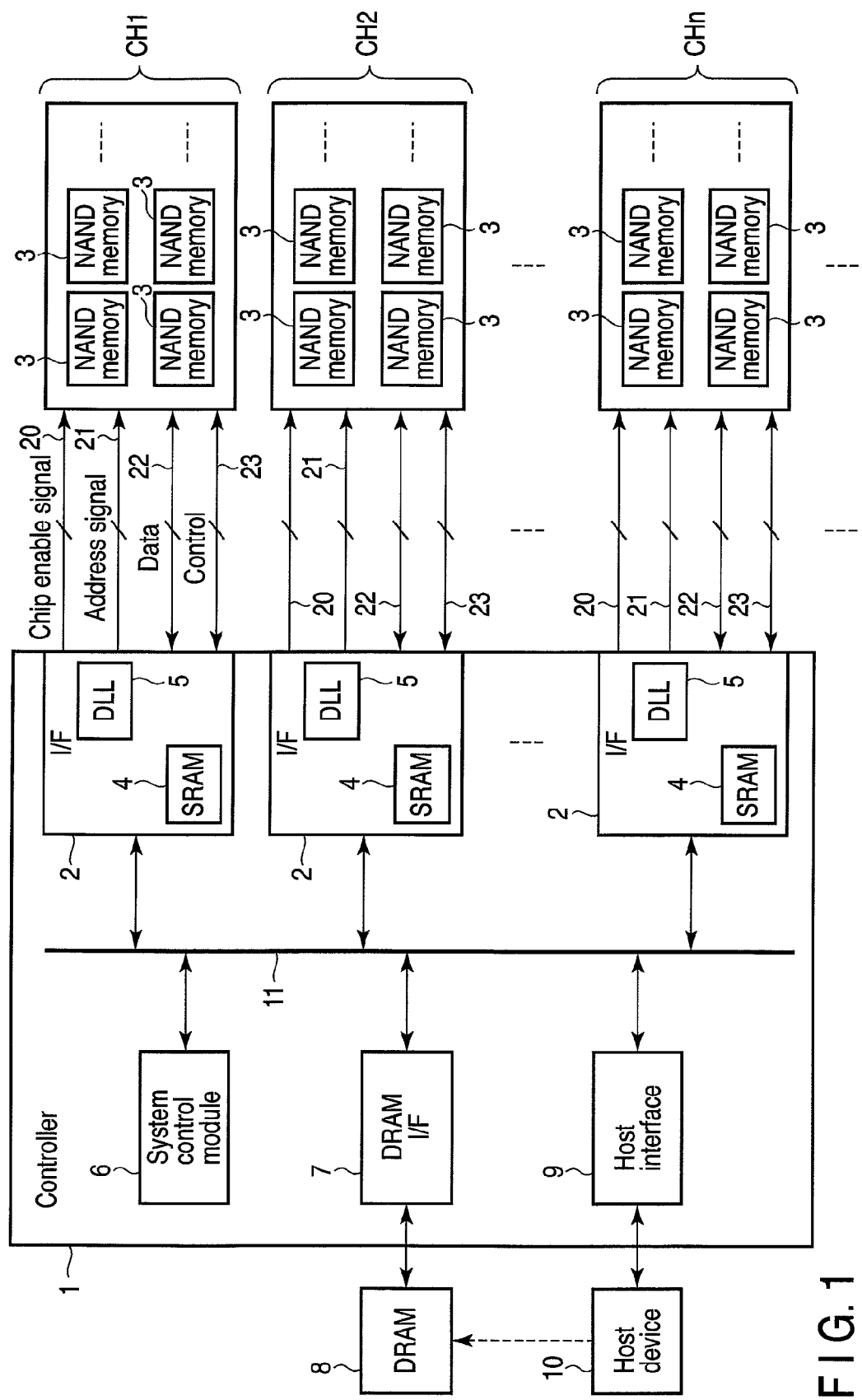
FIG. 1 is a block diagram explaining the configuration of a data storage apparatus according to an embodiment.

FIG. 1 is a block diagram showing the configuration of a data storage apparatus according to an embodiment.

The data storage apparatus according to the embodiment is a solid-state drive (SSD) which incorporates NAND flash memories as recording media. As shown in FIG. 1, the data storage apparatus has a NAND memory controller (hereinafter referred to as a controller) 1, a plurality of NAND flash memories 3, and a dynamic random access memory (DRAM) 8.

Each NAND memory 3 is a packaged flash memory provided for the respective channels (CHn). The DRAM 8 functions as a buffer memory and stores calibration data, which will be described later.

The controller 1 has memory interfaces 2, a system control module 6, a DRAM interface 7, a host interface 9, and a bus 11.

The memory interfaces 2 (hereinafter referred to as interfaces) are associated with a plurality of channels (CHn), respectively. The system control module 6 controls the data writing to, and data reading from, the NAND memories 3 through the interfaces 2. The system control module 6 also performs calibration on each NAND memory 3, as will be descried later in detail.

The DRAM interface 7 controls the data transfer between the DRAM 8 and the bus 11. More precisely, the system control module 6 therefore writes data to the DRAM 8 and reads data from the DRAM 8, through the DRAM interface 7. The host interface 9 controls the transfer of data and commands between the bus 11 and a host device 10. The host device 10 is, for example, a personal computer.

Each interface 2 controls the NAND memories of the associated channel (CHn). The interface 2 is connected by interface signal lines to the NAND memories 3 of the associated channel, and can transmit and receive a chip enable signal 20, an address signal 21, read/write data 22, and a control signal 23, to and from the NAND memories of the associated channel. Each interface 2 has a static random access memory (SRAM) 4 and a delay-locked loop (DLL) 5.

The SRAM 4 operates as a buffer memory. The DLL 5 performs a correction process in order to achieve calibration (timing adjustment of a strobe). The correction process is a process of correcting the phase relationship between data and the strobe.

Figure 2:
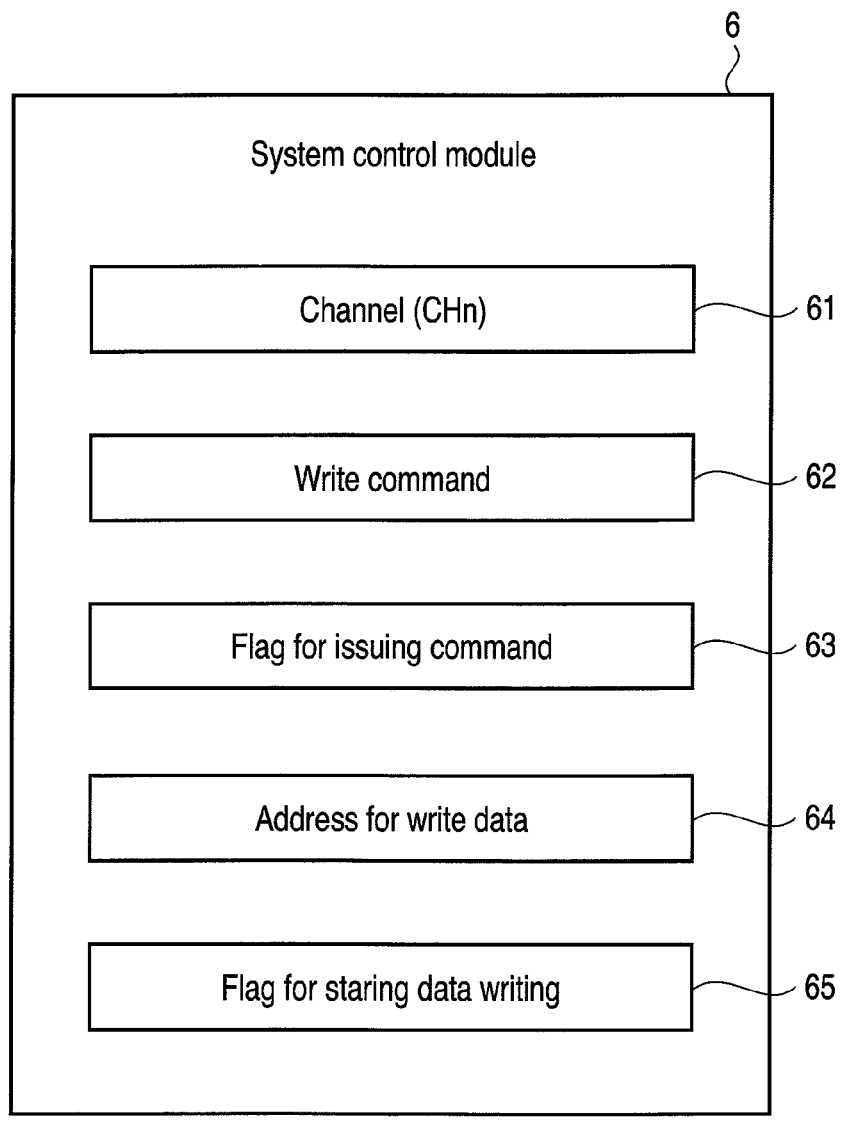
FIG. 2 is a block diagram explaining the configuration of the system control module incorporated in the embodiment.

FIG. 2 is a block diagram explaining the configuration of the system control module 6.

As shown in FIG. 2, the system control module 6 has registers 61 to 65, which are used to accomplish calibration.

Register 61 is used to store data (e.g., channel code CH1, CH2, ..., or CHn) in order to designate one of the channels (CHn) that should be accessed. Note that register 61 can set a plurality of channels at a time.

Register 62 is used to store a command (i.e., write command in this embodiment) that should be issued to any interface 2.

Register 63 is used to store a flag in order to start issuing the command that register 62 has set.

Register 64 is used to store an address in order to designate the data that should be accessed in response to the command. In this embodiment, register 64 is used to store the address in the DRAM 8, at which data is written in accordance with the write command set by register 62. At the address so designated in the DRAM 8, the calibration data is stored.

Register 65 is used to store a flag in order to start writing the data at the address set by register 64.

[Operation of the Data Storage Apparatus]

Figure 3:
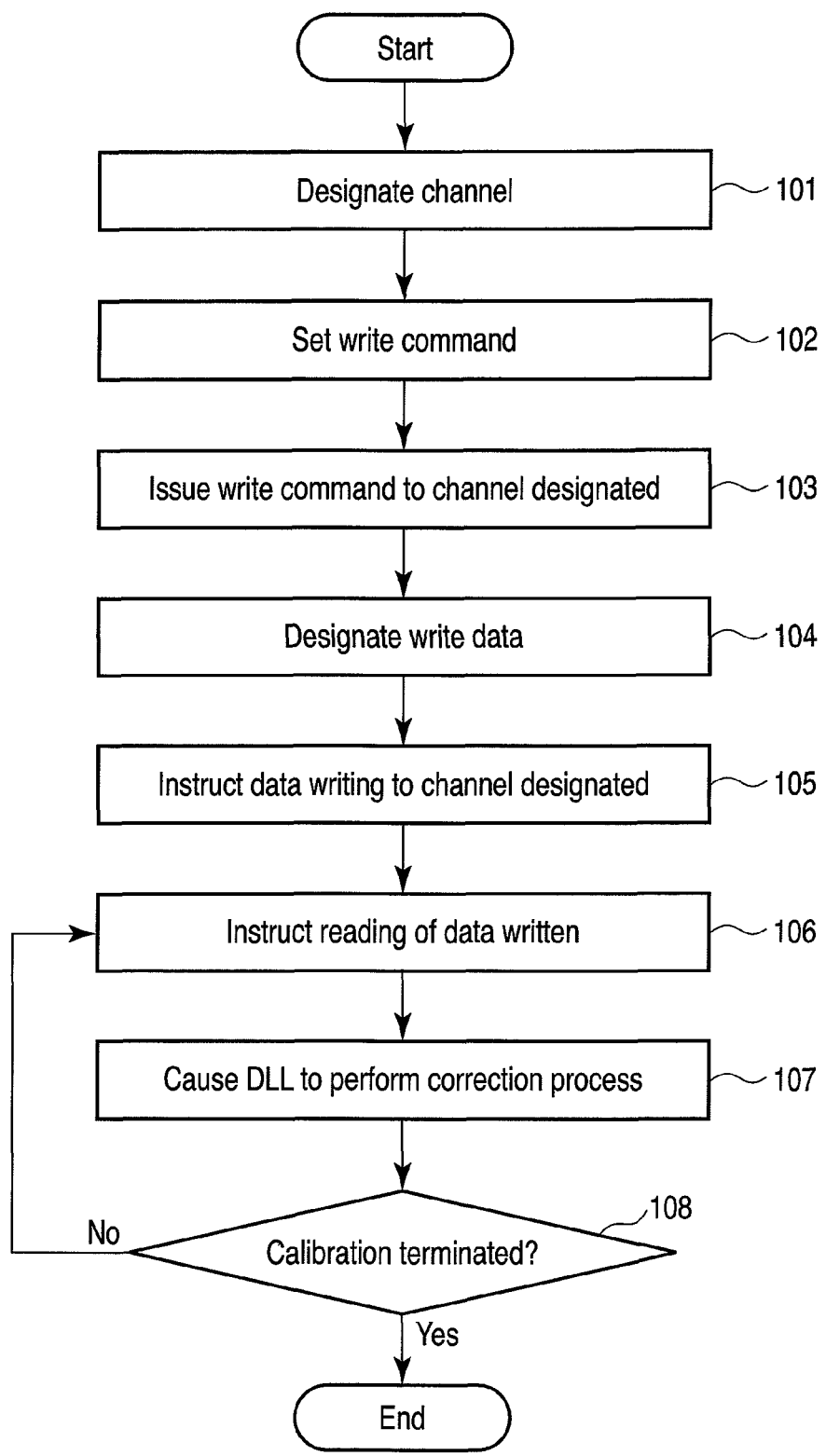
FIG. 3 is a flowchart explaining how calibration is performed in the embodiment.

How a calibration process is performed in the data storage apparatus according to the embodiment will be explained, with reference to the flowchart of FIG. 3.

During the manufacture of the apparatus, for example, the host device 10 executes the calibration software, instructing the controller 1 to perform the calibration. At this point, the host device 10 transmits the calibration data to the controller 1. In the controller 1, the system control module 6 stores the calibration data to the DRAM 8 via the DRAM interface 7.

Then, the system control module 6 sets, to register 61, data (i.e., channel code CH1, CH2, . . . , or CHn) in order to designate one of the channels (CHn) that should be accessed (Block 101). The system control module 6 designates, for example, all channels (CH1 to CHn).

The system control module 6 then sets a write command for writing data to the NAND memories 3 of the associated channel, to register 62 in accordance with the instruction coming from the host device 10 (Block 102). The system control module 6 further sets a flag to register 63, in order to issue the write command set in register 62.

In accordance with the flag set to register 63, the system control module 6 issues the write command to the channels (all channels in this instance) (Block 103). The system control module 6 then sets, to register 64, the address in the DRAM 8, at which to write data (write data) in accordance with the write command (Block 104). This address in the DRAM 8 is the address the host device 10 has designated as address of the calibration data.

The system control module 6 further sets a flag to register 65 (Block 105), instructing that the calibration data should be written to the interfaces 2 associated with the channels designated (i.e., all channels). The interfaces 2 associated with the channels designated (i.e., all channels) therefore assert the chip enable signal 20 at the same time, and transfer the calibration data read from the DRAM 8, to the NAND memories 3 incorporated in the associated packages. The calibration data is thereby written to the NAND memories 3 at the same time.

Thus, the controller 1 can write the calibration data to the NAND memories of the channels designated (i.e., all channels in this instance) at the same time, in accordance with the instruction coming from the host device 10. In other words, the calibration data need not be prepared for each channel in this embodiment, and can be simultaneously written to any channels that should be calibrated.

Hence, the calibration data can be written to the NAND memories 3 for a plurality of channels at high speed in this embodiment. Hitherto described is a case where the calibration data is written to all channels. Nonetheless, the controller 1 can designate only the channel or channels that should be accessed.

After the calibration data has been as written as described above, the host device 10 instructs the controller 1 to adjust the timing of the strobe. More precisely, the host device 10 issues a read command to the interfaces 2 associated to the channels designated (i.e., all channels in this instance), in order to read the calibration data written to the NAND memories 3 of the channels designated (Block 106).

The interface 2 associated to any channel designated reads the calibration data from the NAND memories 3 of the channel. In the interface 2, the DLL 5 performs a correction process to achieve calibration (Block 107). To be more specific, the DLL adjusts the timing of the strobe, or corrects the phase relationship between data and the strobe. When the DLLs 5 associated with all channels designated complete the correction process, the calibration will be terminated (Block 108).

As has been described, this embodiment can perform calibration on the NAND memories of a plurality of channels during the manufacture of the SSD having a large storage capacity. In this case, the calibration data can be written to the NAND memories of a plurality of channels at the same time in the controller 1 of this embodiment. The channels can therefore be calibrated at high speed and with high efficiency. This enhances the efficiency of manufacturing the SSD having a large storage capacity.

The recording media used are NAND flash memories in the embodiment. Nonetheless, the embodiment can be applied to an SSD having memories of any other type that need to be calibrated. In the embodiment described above, the calibration is performed during the manufacture of the SSD. Instead, the calibration can be performed while the SSD is being repaired.

The various modules of the systems described herein can be implemented as software applications, hardware and/or software modules, or components on one or more computers, such as servers. While the various modules are illustrated separately, they may share some or all of the same underlying logic or code. While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A data storage apparatus comprising:
   an interface module configured to control rewritable nonvolatile memories provided for a plurality of channels respectively;
   a memory configured to store calibration data; and
   a controller configured to perform calibration of the nonvolatile memories, the calibration being timing adjustment of a strobe, wherein the controller is configured to:
      issue a command to the interface module for writing the calibration data to the nonvolatile memories of designated channels and an address of the calibration data in the memory;
      write the calibration data read from the memory to the nonvolatile memories of the designated channels through the interface module at the same time; and
      perform the calibration based on the calibration data after the calibration data has been written for all of the designated channels.

2. The apparatus of claim 1, wherein the controller comprises a register module configured to set data that instruct the interface module, to write calibration data to the nonvolatile memories.

3. The apparatus of claim 2, wherein the register module comprises:
   a first register configured to designate a channel; and
   a second register configured to designate the calibration data.

4. The apparatus of claim 3, wherein the register module further comprises a third register configured to set the command to the interface module in order to write the calibration data to the nonvolatile memories.

5. The apparatus of claim 1, wherein the controller comprises a calibration module configured to perform the calibration based on the calibration data written to the nonvolatile memories.

6. The apparatus of claim 5, wherein the controller is configured to cause the calibration module to perform the calibration after the calibration data has been written for all channels designated.

7. The apparatus of claim 5, wherein the calibration module is configured to adjust timing of the strobe based on the calibration data stored in the nonvolatile memories.

8. The apparatus of claim 1, wherein the nonvolatile memories comprise flash memories.

9. A method of calibrating rewritable nonvolatile memories provided for a plurality of channels respectively, the method comprising:

storing calibration data to a memory;

issuing a command for writing the calibration data to the nonvolatile memories of designated channels at an address of the calibration data in the memory;

writing the calibration data read from the memory to the nonvolatile memories of the designated channels at the same time; and performing the calibration based on the calibration data after the calibration data has been written for all of the designated channels, the calibration being timing adjustment of a strobe.

10. The method of claim 9, further comprising setting data that is configured to instruct the writing of calibration data to the nonvolatile memories.

11. The method of claim 10, further comprising designating the calibration data.

12. The method of claim 11, further comprising setting a command for writing the calibration data to the nonvolatile memories.

13. The method of claim 9, wherein the performing the calibration comprises adjusting timing of the strobe based on the calibration data stored in the nonvolatile memories.

14. The method of claim 9, wherein the nonvolatile memories comprise flash memories.

* * * * *